United States Patent
Kawai

(10) Patent No.: US 11,211,924 B2
(45) Date of Patent: Dec. 28, 2021

(54) ELECTRONIC CIRCUIT

(71) Applicant: KABUSHIKI KAISHA TOSHIBA, Minato-ku (JP)

(72) Inventor: Shusuke Kawai, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 486 days.

(21) Appl. No.: 16/290,080

(22) Filed: Mar. 1, 2019

(65) Prior Publication Data

US 2020/0091906 A1    Mar. 19, 2020

(30) Foreign Application Priority Data

Sep. 13, 2018  (JP) ............................ JP2018-171841

(51) Int. Cl.
*H03K 17/082* (2006.01)
*G01R 27/26* (2006.01)
*H03K 17/08* (2006.01)

(52) U.S. Cl.
CPC ..... *H03K 17/0822* (2013.01); *G01R 27/2635* (2013.01); *H03K 2017/0806* (2013.01)

(58) Field of Classification Search
CPC ............. H03K 17/0822; H03K 17/161; H03K 17/04206; H03K 17/687; H03K 17/04123; H03K 2017/0806; H03K 2217/0027; G01R 27/2635; G01R 31/2621; G01R 31/2628; H02M 1/08

See application file for complete search history.

(56) References Cited

U.S. PATENT DOCUMENTS

| | | | |
|---|---|---|---|
| 6,384,552 B2* | 5/2002 | Shimane | B60L 50/51 318/139 |
| 6,903,597 B2* | 6/2005 | Tai | H03K 17/0828 327/434 |
| 2018/0205372 A1* | 7/2018 | Sasaki | H03K 17/0828 |

OTHER PUBLICATIONS

Marco Denk et al., "An IGBT Driver Concept with Integrated Real-Time Junction Temperature Measurement", PCIM Europe 2014, May 20-22, 2014, Nuremberg, Germany, pp. 214-221.

Julio Brandelero et al., "On-line Virtual Junction Temperature Measurement via DC Gate Current Injection", CIPS 2018—10$^{th}$ International Conference on Integrated Power Electronics Systems, 2018, pp. 423-429.

* cited by examiner

*Primary Examiner* — Son T Le
*Assistant Examiner* — Dustin R Dickinson
(74) *Attorney, Agent, or Firm* — Oblon, McClelland, Maier & Neustadt, L.L.P.

(57) ABSTRACT

According to one embodiment, an electronic circuit includes: a current supply circuit, a detection circuit, a timing generation circuit, a sample hold circuit and a calculation circuit. The current supply circuit supplies a sine wave current for measurement to a gate terminal of a semiconductor switching device. The detection circuit detects a sine wave voltage generated in response to supply of the sine wave current to generate a detection signal. The timing generation circuit counts cycles of the sine wave voltage. The sample hold circuit samples the detection signal at a timing depending on a count value of the timing generation circuit. The calculation circuit calculates a gate resistance of the semiconductor switching device based on the sampled voltage.

10 Claims, 6 Drawing Sheets

ELECTRONIC CIRCUIT

CROSS REFERENCE TO RELATED APPLICATIONS

This application is based upon and claims the benefit of priority from the prior Japanese Patent Application No. 2018-171841, filed on Sep. 13, 2018, the entire contents of which are incorporated herein by reference.

FIELD

Embodiments described herein relates to an electronic circuit.

BACKGROUND

A life of a high breakdown voltage semiconductor switching device can be predicted by detecting a junction temperature of the semiconductor switching device. A gate resistance of the semiconductor switching device tends to increase along with an increase in a temperature of the semiconductor switching device. Accordingly, the gate resistance of the semiconductor switching device can be detected to estimate the temperature of the semiconductor switching device and to thereby predict the life of the semiconductor switching device.

There is a technique of inputting a sine wave current to a gate terminal to detect a gate voltage generated at the gate terminal, and calculating a gate resistance based on the detected gate voltage. The influence of parasitic inductor and parasitic capacitor can be ignored by inputting the sine wave current having the same frequency as a resonant frequency determined by the parasitic inductor and the parasitic capacitor of the gate electrode. The voltage across the gate resistor is read by amplifying the voltage across the gate resistor, converting the amplified voltage into a DC (Direct Current) voltage by a detection circuit, and further amplifying the DC voltage. The value of the gate resistance can be calculated based on the read voltage.

However, in this technique, the frequency component of the sine wave current may leak into the output of the detection circuit and lead to an error of the detected voltage, once the detection circuit is turned into an integrated circuit.

There is also a technique of inputting a pulse current to the gate terminal of the high breakdown voltage semiconductor switching device and measuring a gate voltage having a trapezoid wave at two points of time (two-point measurement), the gate voltage being generated due to the parasitic capacitor and the parasitic resistance, to thereby calculate both of the gate resistance and the input current. In this technique, if the parasitic capacitor of the semiconductor switching device is known, the gate resistance can be calculated even when a current value of the pulse current is unknown.

However, when an output resistance of a current source causes an error in a value of current flowing in the gate terminal of the semiconductor switching device, an error occurs in the calculated value of the gate resistance. The gate parasitic inductance of the semiconductor switching device causes a large ringing in a waveform of the gate voltage, whereby the gate voltage and hence the gate resistance cannot be accurately calculated.

DETAILED DESCRIPTION

According to one embodiment, an electronic circuit includes: a current supply circuit, a detection circuit, a timing generation circuit, a sample hold circuit and a calculation circuit.

The current supply circuit supplies a sine wave current for measurement to a gate terminal of a semiconductor switching device.

The detection circuit detects a sine wave voltage generated in response to supply of the sine wave current to generate a detection signal.

The timing generation circuit counts cycles of the sine wave voltage.

The sample hold circuit samples the detection signal at a timing depending on a count value of the timing generation circuit.

The calculation circuit calculates a gate resistance of the semiconductor switching device based on the sampled voltage.

Hereinafter, embodiments of the present invention will be described with reference to drawings.

Figure 1:
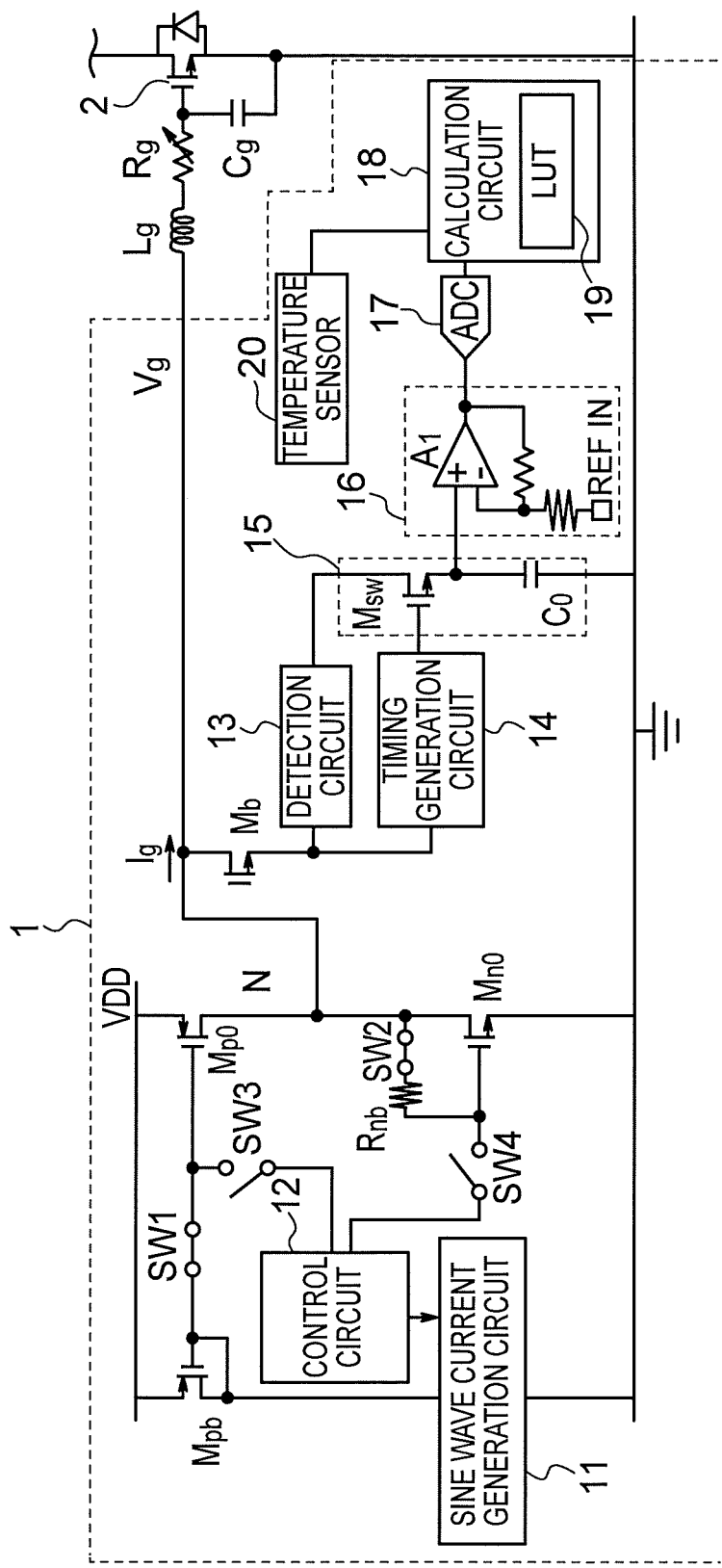
FIG. 1 is a diagram illustrating an electronic circuit according to a first embodiment.

FIG. 1 illustrates a drive system including an electronic circuit according to the present embodiment. The drive system includes an electronic circuit 1 and a semiconductor switching device 2.

The semiconductor switching device 2 is a high breakdown voltage semiconductor device that is switched between an ON state and an OFF state by a control signal (control voltage) supplied from the electronic circuit 1. In the present embodiment, the semiconductor switching device 2 is a high breakdown voltage power MOS transistor. The semiconductor switching device 2 includes a parasitic resistor Rg, a parasitic capacitor Cg, and a parasitic inductor Lg as parasitic components. The high breakdown voltage power MOS transistor is exemplary, and the semiconductor switching device may be any other type of device. For example, the semiconductor switching device 2 may be an IGBT (Insulated Gate Bipolar Transistor), a thyristor, or the like, or may be a device using a compound semiconductor such as SiC (silicon carbide), GaN (gallium nitride), or the like. The electronic circuit 1 controls ON/OFF of the semiconductor switching device 2 to thereby drive a load (not illustrated) connected to the semiconductor switching device 2. When the semiconductor switching device 2 is turned on, a current is supplied to the load. Examples of the load include a motor in an air conditioner, a refrigerator, a train, a robot, or the like, a PFC (Power Factor) circuit for a server power supply, or the like.

The electronic circuit 1 includes a sine wave current generation circuit 11 that generates a sine wave current having a predetermined frequency, a control circuit 12, a detection circuit 13, a timing generation circuit 14, a sample hold circuit 15, an amplification circuit 16, an ADC (Analog to Digital Converter) 17, a calculation circuit 18, and a temperature sensor 20. The electronic circuit 1 includes four switches SW1, SW2, SW3, and SW4, two PMOS transistors Mpb and Mp0, three NMOS transistors Mn0, Mb, and Msw, and a resistor Rnb. By way of example, the PMOS transistor Mp0 corresponds to a first transistor, the NMOS transistor Mn0 corresponds to a second transistor, and the PMOS transistor Mpb corresponds to a third transistor. The electronic circuit 1 is configured, for example, as one chip, and a gate terminal (hereinafter, simply referred to as a gate) of the semiconductor switching device 2 is connected to the terminal of the chip.

By way of example, the control circuit 12, the PMOS transistor Mp0, the NMOS transistor Mn0, and the switches SW3 and SW4 correspond to a drive circuit (gate drive circuit) of the semiconductor switching device 2. The control circuit 12, the sine wave current generation circuit 11, the PMOS transistors Mpb and Mp0, the NMOS transistor Mn0, the switches SW1 and SW2, and the resistor Rnb correspond to a current supply circuit configured to supply a sine wave current to the gate of the semiconductor switching device 2. The PMOS transistor Mp0, and the NMOS transistor Mn0 are used for both of the drive circuit and the current supply circuit.

The control circuit 12 controls ON/OFF of the PMOS transistor Mp0 and the NMOS transistor Mn0 to thereby supply the control voltage (gate voltage) to the semiconductor switching device 2 and control the driving of the semiconductor switching device 2. The control circuit 12 controls ON/OFF of the PMOS transistor Mp0 and the NMOS transistor Mn0 by the control voltage to be supplied to the gates of the respective transistors. The switches SW3 and SW4 are on while the semiconductor switching device 2 is driven, and the switches SW3 and SW4 are off during other periods of time. Note that FIG. 1 illustrates a state where the switches SW1 and SW2 are on, and the switches SW3 and SW4 are off.

Figure 2:
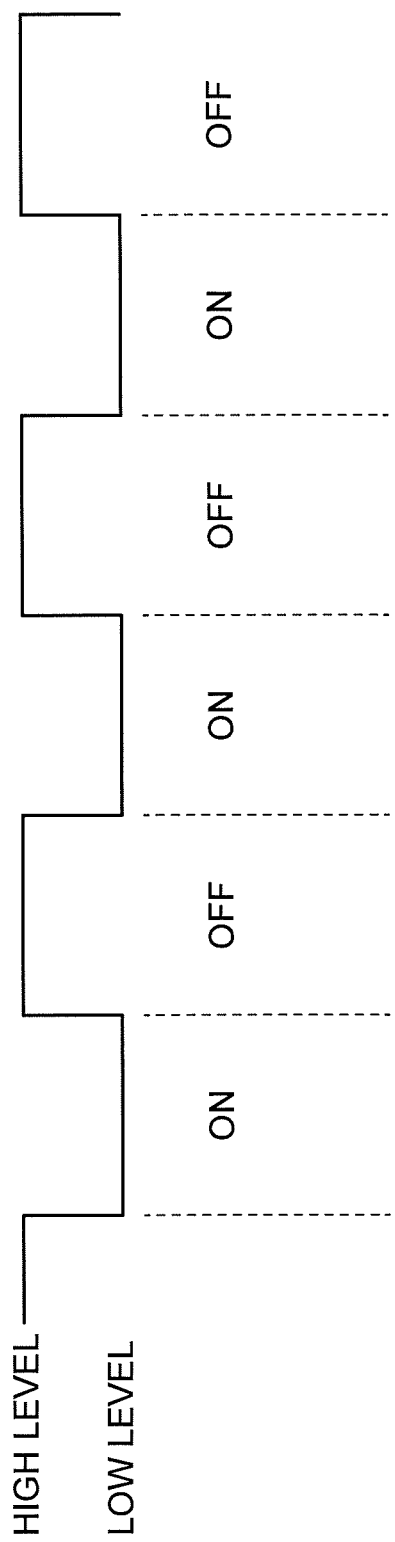
FIG. 2 illustrates an exemplary control voltage supplied to a transistor.

FIG. 2 illustrates an exemplary control voltage supplied to the PMOS transistor Mp0 and the NMOS transistor Mn0. These transistors are supplied with the same control voltage. Since a low-level voltage is supplied to these transistors during a driving period (a period of switch "ON" in FIG. 2) of the semiconductor switching device 2, the PMOS transistor Mp0 is turned on and the NMOS transistor Mn0 is turned off. In this way, the control voltage corresponding to a power supply voltage VDD connected to a source terminal (hereinafter referred to as a source) of the PMOS transistor Mp0 is supplied to the gate of the semiconductor switching device 2 through the PMOS transistor Mp0. Since this control voltage is larger than a threshold voltage of the semiconductor switching device 2, the semiconductor switching device 2 is turned on. On the other hand, since a high-level voltage is supplied to the PMOS transistor Mp0 and the NMOS transistor Mn0 during a non-driving period (a period of switch "OFF" in FIG. 2) of the semiconductor switching device 2, the PMOS transistor Mp0 is turned off and the NMOS transistor Mn0 is turned on. In this way, the gate voltage of the semiconductor switching device 2 is less than the threshold voltage, and then the semiconductor switching device 2 is turned off. By way of example, the control circuit 12 controls the driving of the semiconductor switching device 2 so that the driving period and the non-driving period are alternately repeated at a predetermined switching period.

In the present embodiment, a measurement process for the gate resistance and temperature (junction temperature) of the semiconductor switching device 2 is performed during the non-driving period (off period) of the semiconductor switching device 2. Specifically, during the off period, a sine wave current for measurement is input to the gate of the semiconductor switching device 2 to detect a sine wave voltage (gate voltage) which is generated at the gate terminal in response to the input of the sine wave current. The gate resistance is calculated based on the detected gate voltage, and the temperature of the semiconductor switching device 2 is calculated based on the gate resistance. The measurement process will be described below in detail.

During the off period, the switches SW3 and SW4 are off. The switches SW1 and SW2 are on at least while the measurement process is performed in the off period. Accordingly, the switches SW3 and SW4 and the switches SW1 and SW2 are alternately turned on/off, but there may be a period during which all of the switches SW1 to SW4 are off. The switches SW1 to SW4 are controlled by the control circuit 12.

When the timing for starting the measurement process comes, the sine wave current generation circuit 11 outputs the sine wave current. The sine wave current generation circuit 11 is controlled by the control circuit 12. The start timing is timing after a lapse of a predetermined time from the start time of the off period. The sine wave current generated by the sine wave current generation circuit 11 has the same or almost the same frequency as a resonant frequency of the equivalent circuit including the parasitic components Lg and Cg of the semiconductor switching device 2. In this way, the influence of the parasitic components Lg and Cg is eliminated or reduced, thereby achieving input of the sine wave current to the gate of the semiconductor switching device 2. When the current to be input to the gate is deviated from the resonant frequency, the current amplitude changes due to the influence of a resonant circuit, resulting in a failure to measure the gate resistance and hence the temperature of the semiconductor switching device 2 with high accuracy. Thus, it is assumed that only Rg is present as the parasitic component, and the parasitic components Lg and Cg are not present by inputting the sine wave current having the same or almost the same frequency as the resonant frequency to the gate. In this way, the gate resistance and temperature of the semiconductor switching device can be measured with high accuracy.

The sine wave current generated by the sine wave current generation circuit 11 is mirrored on the output side by a current mirror circuit including a pair of PMOS transistors Mpb and Mp0, and is output from the PMOS transistor Mp0. This current flows, as a gate current Ig, in a direction from a connection node N between the PMOS transistor Mp0 and the NMOS transistor Mn0 to the gate of the semiconductor switching device 2. The gate of the semiconductor switching device 2 and a drain terminal (hereinafter, referred to as a drain) of the NMOS transistor Mn0 are connected to the gate of the NMOS transistor Mn0 through the switch SW2 and the resistor Rnb. During the measurement process, the switch SW2 is on. The NMOS transistor Mn0 has a diode connection configuration, and can thereby generate and apply a bias voltage accurately to the gate terminal. When this bias voltage is applied to the node N, the above-described mirrored current is output from the node N as a gate current Ig. Since the resistor Rnb is sufficiently large compared to the gate resistance, the mirrored current scarcely flows to the NMOS transistor Mn0 side, and flows to the semiconductor switching device 2 side.

Figure 3:
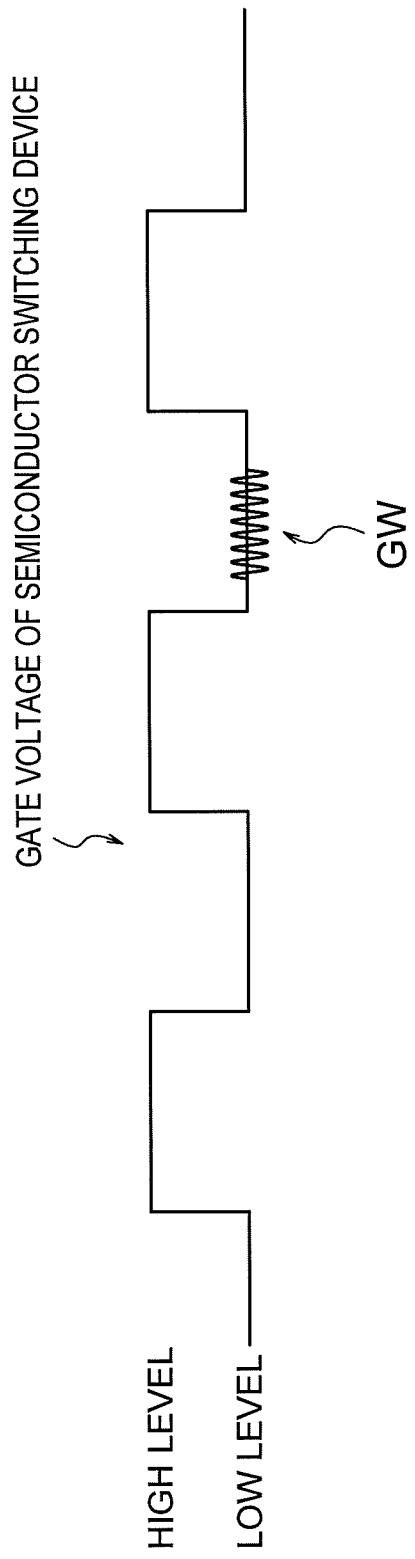
FIG. 3 illustrates an exemplary gate voltage of a semiconductor switching device when a sine wave current is input to a gate terminal.

FIG. 3 illustrates an exemplary sine wave voltage (gate voltage signal of a semiconductor switching device 2) generated when a sine wave current is input during an off period of the semiconductor switching device 2. Since the sine wave current is input during the off period being subsequent to the second on period of FIG. 2, a voltage signal (sine wave voltage) GW corresponding to the sine wave current to be input is generated. Since this voltage GW is less than the threshold voltage of the semiconductor switching device 2, the semiconductor switching device 2 is kept off even when the sine wave voltage is applied to the gate.

In the present embodiment, the PMOS transistor Mp0 is shared by the drive circuit of the semiconductor switching device 2 and the current supply circuit (circuit configured to supply a sine wave current for measuring the gate resistance and the temperature). That is, the PMOS transistor Mp0 is used not only as a drive transistor but also as a part of a path of the sine wave current. Therefore, it is not necessary to additionally provide the path for inputting the current to the gate of the semiconductor switching device 2, and the chip area can be reduced. The NMOS transistor Mn0 is also shared by the drive circuit of the semiconductor switching device 2 and the current supply circuit. That is, the NMOS transistor Mn0 is used not only as a drive transistor but also as a part of a circuit for applying the bias voltage. Therefore, it is not necessary to additionally provide the circuit for applying the bias voltage, and the chip area can be reduced.

The drain of the NMOS transistor Mb is connected to the path (wiring) between the gate of the semiconductor switching device 2 and the connection node N between the PMOS transistor Mp0 and the NMOS transistor Mn0. The NMOS transistor Mb interrupts the detection circuit 13 from a drive system of the semiconductor switching device 2 when the semiconductor switching device 2 is driven (i.e., during a normal operation). The PMOS transistor Mp0 is turned off during the on period of the semiconductor switching device 2, and is turned on during the measurement process. The PMOS transistor Mp0 is controlled by the control circuit 12. Since the PMOS transistor Mp0 is on during the measurement process, the voltage (sine wave voltage) generated at the gate in response to the sine wave current is input to the detection circuit 13 and the timing generation circuit 14 through the PMOS transistor Mp0.

The detection circuit 13 is a circuit that is subject to envelope detection of the voltage signal (sine wave voltage), and converts a detection signal indicating a peak voltage into a DC voltage. During the measurement process, the sine wave voltage GW shown in FIG. 3 is input to the detection circuit 13.

Figure 4:
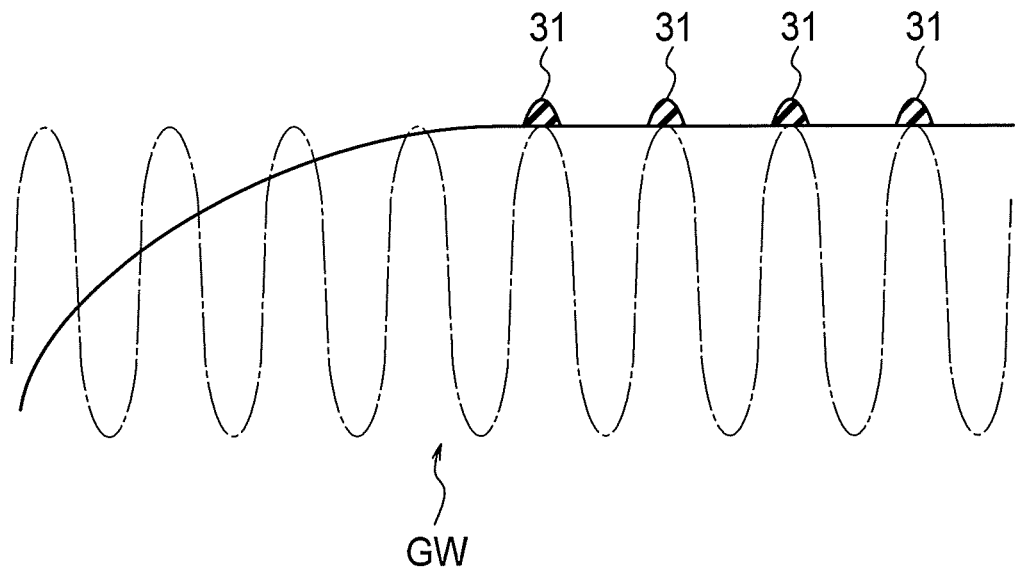
FIG. 4 shows an example of an operation of a detection circuit.

FIG. 4 shows an example of an operation of the detection circuit 13. A dashed line shows the sine wave voltage GW. A solid line shows an envelope including the peak voltages (amplitudes) detected by the detection circuit 13. Since the detection circuit 13 has a time constant, the time is required for convergence of the voltages. The frequency component (high frequency component) of the peak of the sine wave is leaked into the output voltage of the detection circuit 13 from a device (an operational amplifier, or the like) in the detection circuit 13 as signals 31 and is superimposed on the peaks of the sine wave. Accordingly, to accurately detect the voltages (DC voltages) based on the detected envelope, it is necessary to detect the voltages at the timing with no signal 31 after the convergence of the voltages. In the present embodiment, the voltages are detected by the timing generation circuit 14 and the sample hold circuit 15 at the timing with no signal 31.

The sample hold circuit 15 is arranged in a subsequent stage of the detection circuit 13, and includes an NMOS transistor Msw and a capacitor C0. The drain of the NMOS transistor Msw is connected to the output terminal of the detection circuit 13. The source of the NMOS transistor Msw is connected to one end of the capacitor C0. The other end of the capacitor C0 is connected to a reference voltage terminal (ground terminal). The gate of the NMOS transistor Msw is connected to the output terminal of the timing generation circuit 14, so that a trigger signal of a sampling is applied from the timing generation circuit 14. The trigger signal has a voltage higher than a threshold voltage of the NMOS transistor Msw. The sample hold circuit 15 samples the output voltages (envelope) of the detection circuit 13 at the timing at which the trigger signal is applied.

Figure 5:
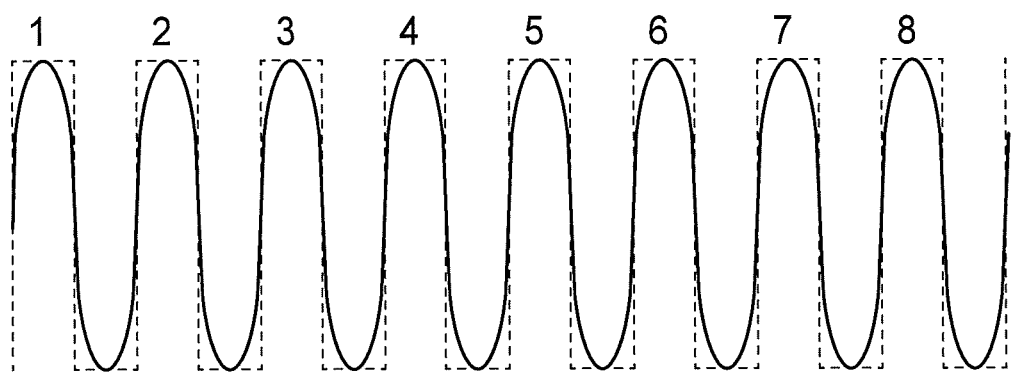
FIG. 5 shows an example in which clocks synchronized with a sine wave are generated.

The timing generation circuit 14 generates a clock (pulse) synchronized with the sine wave voltage to be input, and counts the number of clock cycles. The count value is increased by one per cycle. By way of example, the count value is increased on the rising edge of the clock in each cycle. When the count value reaches a predetermined number of clock cycles, the timing generation circuit 14 outputs the trigger signal to the sample hold circuit 15. The predetermined value corresponds to the time much longer than a time constant of the output of the detection circuit 13. FIG. 5 shows a specific example.

FIG. 5 shows an example in which clocks synchronized with the sine wave voltage are generated. Serial numbers from one shown in FIG. 5 indicate the clock serial number.

Figure 6:
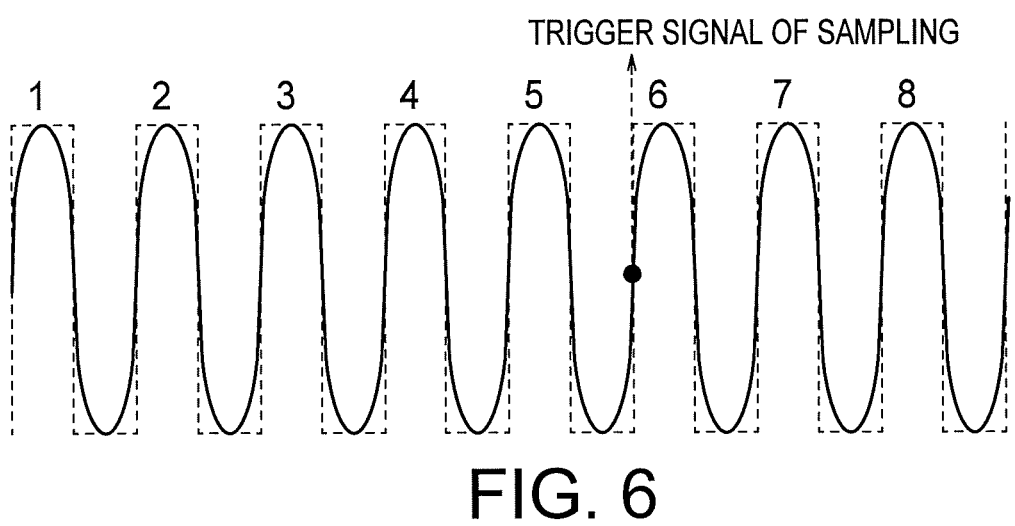
FIG. 6 shows an example in which a trigger signal is output at the rising edge timing of the clock.

FIG. 6 shows an example in which a trigger signal is output at the rising edge timing of the sixth clock.

Figure 7:
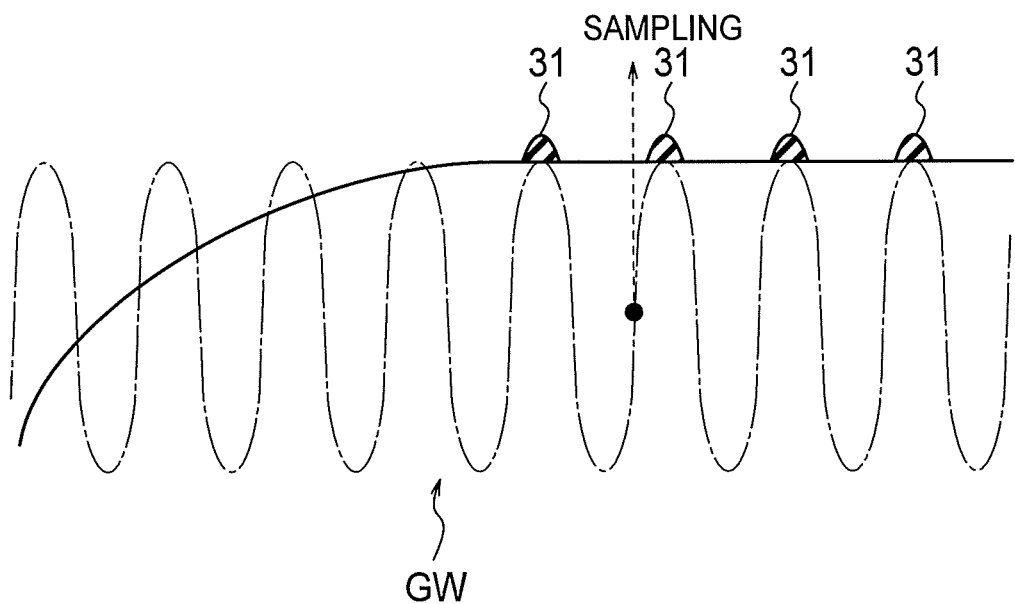
FIG. 7 shows an example in which an output voltage of the detection circuit is sampled according to the trigger signal.

FIG. 7 shows an example in which the sample hold circuit 15 samples an output voltage of the detection circuit 13 based on the trigger signal output at the timing of FIG. 6. Since the sampling is performed at the timing sufficiently after the time constant of the output of the detection circuit 13, the voltage is converged, and the sampling timing is avoided from the generation timing of the signal 31. That is, since the signal 31 is generated at the peak of the sine wave, the sampling is performed at the start of the clock cycle so that the voltage can be detected while avoiding the generation timing of the signal 31.

It may be determined in advance, based on a simulation, an experiment, or the like, that the sampling should be performed in which clock cycle to detect the converged voltage. It is only required that the determined value is stored in a storage such as a buffer in the timing generation circuit 14 or a memory accessible from the timing generation circuit 14. The stored value may be changed by a command value given by an external device. The stored value corresponds to the above-described predetermined number of clock cycles. The timing generation circuit 14 outputs the trigger signal at a point in time when the number of clock cycles corresponding to the stored value is counted (in this example, at a point in time when the sixth clock is counted at the rising edge). The sample hold circuit 15 performs the sampling in response to the reception of the trigger signal. That is, the sample hold circuit 15 performs the sampling at the timing according to the count value of the clock cycles. The above-described buffer or memory may be any storage such as a random access memory (RAM), a read only memory (ROM), a programmable read-only memory (PROM), an erasable programmable read-only memory (EPROM), an electrically erasable programmable read-only memory (EEPROM), a non-volatile random access memory (NVRAM), a flash memory, and a register.

Figure 8:
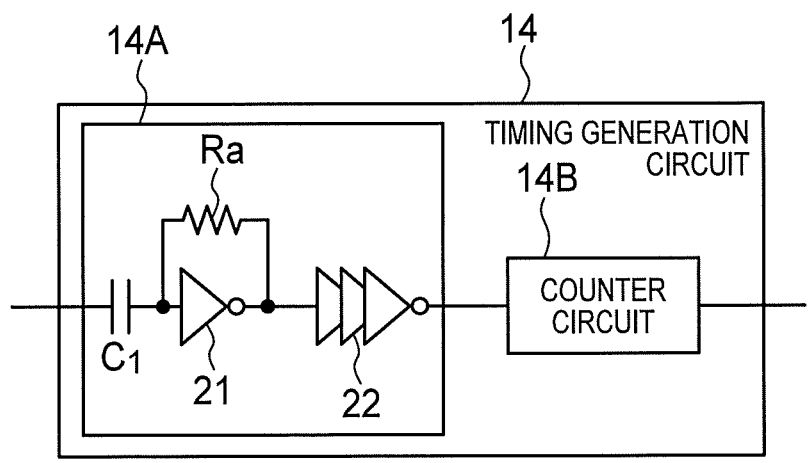
FIG. 8 is a diagram illustrating a configuration example of a timing generation circuit.

FIG. 8 is a diagram illustrating a configuration example of the timing generation circuit 14. The timing generation circuit 14 includes a clock generation circuit 14A and a counter circuit 14B. The clock generation circuit 14A generates a clock synchronized with the sine wave voltage to be input. The clock generation circuit 14A is a circuit including a capacitor C1, an inverter 21, and a plurality of cascade-connected inverters 22. The input and output of the inverter 21 are connected through a high resistor Ra. The counter circuit 14B is a circuit in which a plurality of flip flops are cascaded. This configuration is a simple configuration and small size while the trigger signal of the sample hold circuit 15 can be output at a point in time when a predetermined number of clock cycles is counted.

The amplification circuit 16 is connected to the output terminal of the sample hold circuit 15, and amplifies the voltage sampled by the sample hold circuit 15 by an amplifier (operational amplifier) A1.

The ADC 17 converts the amplified voltage into a digital value by AD conversion, and outputs the digital value to the calculation circuit 18.

The temperature sensor 20 detects a temperature Tc (chip temperature) inside the electronic circuit 1, and outputs a value of the detected temperature Tc to the calculation circuit 18. Specific examples of the temperature sensor 20 include a diode. Note that the temperature Tc inside the electronic circuit 1 may be different from the temperature Ts of the semiconductor switching device 2 or may be the same as the temperature Ts of the semiconductor switching device 2. Accordingly, the temperature Ts of the semiconductor switching device 2 needs to be calculated separately from the temperature Tc inside the electronic circuit 1.

The calculation circuit 18 calculates the gate resistance Rg based on a value of the temperature Tc detected by the temperature sensor 20 and the digital value (gate voltage) input from the ADC 17. By way of example, the calculation circuit 18 may be comprised of a general purpose processor, a central processing unit (CPU), a microprocessor, a digital signal processor (DSP), a controller, a microcontroller, an application specific integrated circuit, a field programmable gate array (FPGA), a programmable logic device (PLD), or the like.

Here, the gate voltage Vg, the gate resistance Rg, and the gate current Ig satisfy the relationship of Vg=Ig×Rg.

The gate voltage Vg is represented by a digital value input from the ADC 17. Accordingly, once the gate current Ig is known, the gate resistance Rg can be determined. The gate current Ig is determined using a look-up table (LUT) 19. The LUT 19 holds the chip temperature Tc and the value of the gate current (a current value of the sine wave current supplied to the gate) in the manner in which they are associated with each other.

The output resistances of various transistors such as the transistor Mp0 change depending on the temperature, and the current flowing in the gate changes depending on the temperature. Then, the relationship between the chip temperature and the current value of the sine wave current flowing in the gate is determined by the experiment, the simulation, or the like in advance by changing the multiple chip temperatures while generating the sine wave current having the same amplitude and frequency. The information indicating the relationship of correspondence between the obtained chip temperature and the sine wave current value (association information between the temperature and the current) is stored in the LUT 19. The current value of the sine wave current is, for example, a current value corresponding to a peak (amplitude) of the sine wave voltage.

The calculation circuit 18 determines the current value corresponding to the chip temperature Tc detected by the temperature sensor 20 from the LUT 19. The gate resistance Rg is determined by substituting the determined current value and the digital value (gate voltage Vg) input from the ADC 17 in the above-described relational expression (Vg=Ig×Rg). Note that in case where the chip temperature is almost constant, a predetermined current value may be used and the LUT 19 may be omitted. It is only required that the LUT 19 is stored in a storage such as a buffer in the calculation circuit 18 or a memory accessible from the calculation circuit 18. Specific examples of the buffer or the memory are the same as described above.

The calculation circuit 18 calculates the temperature Ts of the semiconductor switching device 2 based on the gate resistance Rg. Since the temperature Ts of the semiconductor switching device 2 has a certain relationship (proportional relationship) with the gate resistance Rg, once the gate resistance Rg is known, the temperature Ts of the semiconductor switching device 2 can be calculated. The information indicating the relationship between the temperature of the semiconductor switching device 2 and the gate resistance (association information between the temperature and the resistance) is given in advance. The temperature Ts of the semiconductor switching device 2 is calculated based on the obtained gate resistance Rg and the above-described association information between the temperature and the resistance. The association information between the temperature and the resistance may be defined in the form of mathematical equations or in the form of look-up table.

The calculation circuit 18 can perform an arbitrary operation using the temperature Ts of the semiconductor switching device 2. For example, the calculation circuit 18 predicts the life of the semiconductor switching device 2, and the life of a system on which the semiconductor switching device 2 is mounted.

As described above, according to the first embodiment, the gate voltage can be detected with high accuracy by inputting the sine wave current to the gate and detecting the voltage (sine wave voltage) generated at the gate at the timing other than peaks. Therefore, the gate resistance and temperature of the semiconductor switching device 2 can be calculated with high accuracy. Since the PMOS transistor Mp0 and the NMOS transistor Mn0 used for drive of the semiconductor switching device 2 are used for a circuit for supplying the sine wave current, it is not necessary to additionally provide a path for supplying the sine wave current. Since the NMOS transistor Mn0 can apply the bias voltage to the sine wave current, it is not necessary to additionally provide the circuit for applying the bias voltage, and the chip area can be reduced.

Figure 9:
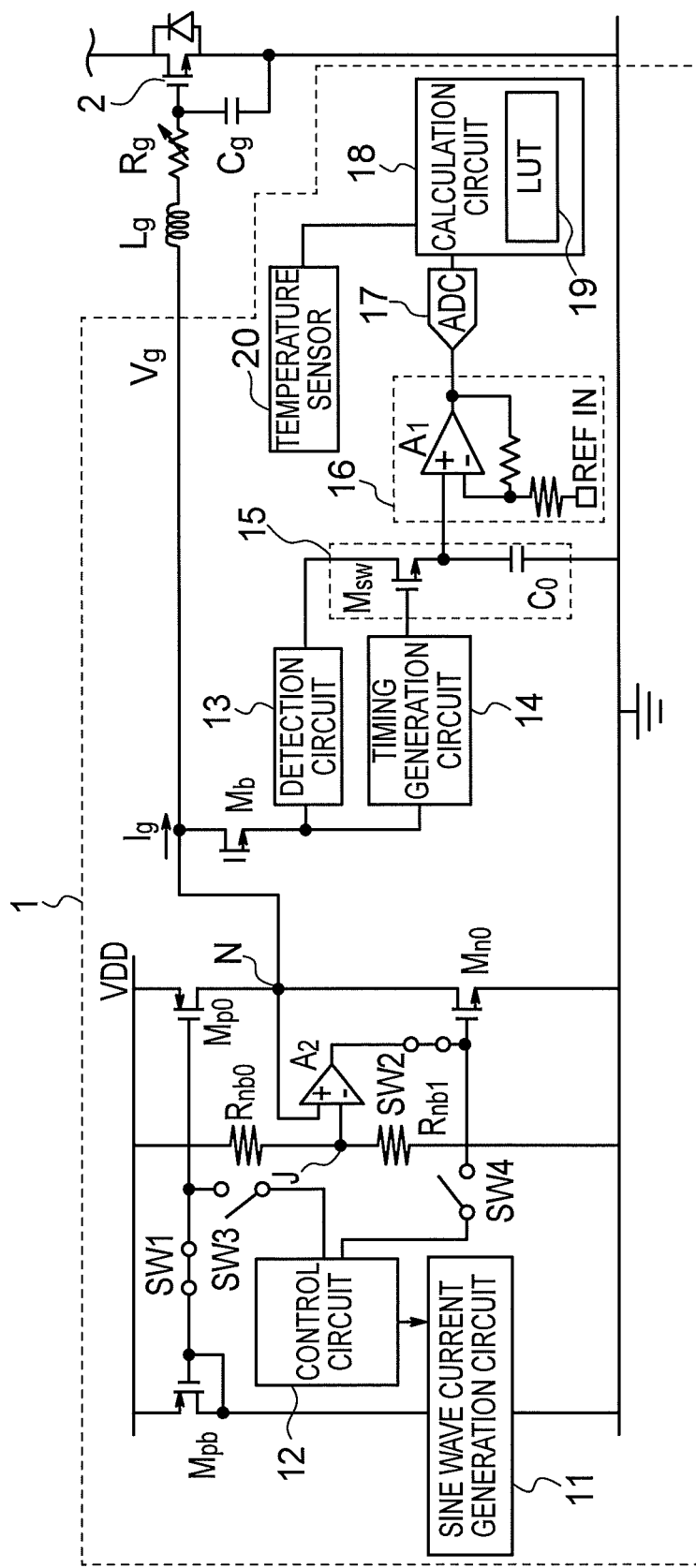
FIG. 9 is a diagram illustrating an electronic circuit according to a second embodiment.

FIG. 9 is a diagram illustrating an electronic circuit according to a second embodiment. The description about devices which are the same as or equivalent to those in FIG. 1 is omitted as appropriate except for an expanded operation and a changed operation.

A resistor Rnb0 and a resistor Rnb1 are connected in series between the power supply voltage VDD and the reference voltage. The reference voltage determined by resistive voltage division using the resistor Rnb0 and the resistor Rnb1 is generated at a connection node J between the resistor Rnb0 and the resistor Rnb1. The connection node 3 is connected to a negative terminal of the amplifier (operational amplifier) A2. A positive terminal of the amplifier A2 is connected to a connection node N between the PMOS transistor Mp0 and the NMOS transistor Mn0. The output terminal of the amplifier A2 is connected to the gate of the NMOS transistor Mn0 through the switch SW2.

The amplifier A2 performs feedback control on the NMOS transistor Mn0 so that a difference between the reference voltage of the connection node J and the gate voltage Vg is decreased, i.e., these voltages are equal to each other. Thus, the output resistance of the NMOS transistor Mn0 is increased, and therefore the sine wave current supplied from the PMOS transistor Mp0 flows more easily in the gate of the semiconductor switching device 2. Therefore, the gate voltage can be detected with low power consumption.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic circuit, comprising:
   a current supply circuit configured to supply a sine wave current for measurement to a gate terminal of a semiconductor switching device;
   a detection circuit configured to detect a sine wave voltage generated in response to supply of the sine wave current to generate a detection signal;
   a timing generation circuit configured to count cycles of the sine wave voltage;
   a sample hold circuit configured to sample the detection signal at a timing depending on a count value of the timing generation circuit; and
   a calculation circuit configured to calculate a gate resistance of the semiconductor switching device based on the sampled voltage.

2. The electronic circuit according to claim 1, wherein the current supply circuit includes:
   a sine wave current generation circuit configured to generate the sine wave current;
   a first transistor configured to supply the sine wave current to the gate terminal;
   a second transistor connected to the first transistor, and configured to apply a bias voltage to the gate terminal, wherein a connection node between the first transistor and the second transistor is electrically connected to the gate terminal.

3. The electronic circuit according to claim 2, further comprising:
   a control circuit configured to
   control the first transistor and the second transistor to supply a driving control voltage to the gate terminal of the semiconductor switching device in a driving period of the semiconductor switching device, and
   control the first transistor and the second transistor to supply the sine wave current to the gate terminal in a non-driving period of the semiconductor switching device.

4. The electronic circuit according to claim 2, wherein one end of the second transistor on the first transistor side is connected with a control terminal of the second transistor through a resistor.

5. The electronic circuit according to claim 2, further comprising:
   an operational amplifier configured to control the second transistor to decrease a difference between a voltage of the gate terminal and a predetermined reference voltage.

6. The electronic circuit according to claim 1, wherein the timing generation circuit generates a trigger signal when the count value reaches a predetermined value, and
   the sample hold circuit samples the detection signal according to the trigger signal.

7. The electronic circuit according to claim 1, wherein the timing generation circuit generates a clock having same period as that of the sine wave voltage, and the timing generation circuit counts cycles of the clock.

8. The electronic circuit according to claim 1, further comprising:
   a temperature sensor configured to measure a temperature of the electronic circuit,
   wherein the calculation circuit specifies a value of the sine wave current corresponding to the temperature measured by the temperature sensor based on association information between a value of the sine wave current supplied to the gate terminal and the temperature in the electronic circuit, and
   the calculation circuit calculates the gate resistance based on the specified value of the sine wave current and the sampled voltage.

9. The electronic circuit according to claim 1, further comprising
   an analog-digital converter configured to convert the sampled voltage into a digital value,
   wherein the calculation circuit specifies the sampled voltage based on the digital value.

10. The electronic circuit according to claim 1, wherein the calculation circuit calculates a temperature of the semiconductor switching device based on the gate resistance.

* * * * *